United States Patent [19]
Liu et al.

[11] Patent Number: 6,066,525
[45] Date of Patent: May 23, 2000

[54] METHOD OF FORMING DRAM CAPACITOR BY FORMING SEPARATE DIELECTRIC LAYERS IN A CMOS PROCESS

[75] Inventors: Yauh-Ching Liu, Sunnyvale; Ruggero Castagnetti, San Jose; Subramanian Ramesh, Cupertino, all of Calif.

[73] Assignee: LSI Logic Corporation, Milpitas, Calif.

[21] Appl. No.: 09/365,455

[22] Filed: Aug. 2, 1999

Related U.S. Application Data

[62] Division of application No. 09/057,156, Apr. 7, 1998.

[51] Int. Cl.[7] .............................................. H01L 21/8242
[52] U.S. Cl. ........................ 438/241; 438/251; 438/394
[58] Field of Search ................................ 438/241, 238, 438/239, 240, 250, 251, 381, 393, 394, 3

[56] References Cited

U.S. PATENT DOCUMENTS

| | | | |
|---|---|---|---|
| 4,075,045 | 2/1978 | Rideout | 438/251 |
| 4,163,243 | 7/1979 | Kamins et al. | 257/303 |
| 4,391,032 | 7/1983 | Schulte | 438/251 |
| 4,466,177 | 8/1984 | Chao | 438/251 |
| 4,505,026 | 3/1985 | Bohr et al. | 29/577 |
| 4,577,390 | 3/1986 | Haken | 438/396 |
| 4,656,729 | 4/1987 | Kroll, Jr. et al. | 39/571 |
| 4,760,034 | 7/1988 | Barden | 438/251 |
| 4,997,774 | 3/1991 | Kim | 437/30 |
| 5,013,692 | 5/1991 | Ide et al. | 437/241 |
| 5,023,750 | 6/1991 | Hirayama | 257/296 |
| 5,071,784 | 12/1991 | Takeuchi et al. | 438/240 |
| 5,073,515 | 12/1991 | Roehl et al. | 438/386 |
| 5,187,636 | 2/1993 | Nakao | 257/310 |
| 5,254,489 | 10/1993 | Nakata | 437/40 |
| 5,284,786 | 2/1994 | Sethi | 437/43 |
| 5,293,336 | 3/1994 | Ishii et al. | 439/240 |
| 5,358,892 | 10/1994 | Rolfson | 437/70 |
| 5,363,325 | 11/1994 | Sunouchi et al. | 257/370 |
| 5,420,060 | 5/1995 | Gill et al. | 437/52 |
| 5,429,972 | 7/1995 | Anjum et al. | 437/47 |
| 5,498,890 | 3/1996 | Kim et al. | 257/310 |
| 5,608,249 | 3/1997 | Gonzalez | 257/306 |
| 5,661,319 | 8/1997 | Fujii et al. | 257/295 |
| 5,700,708 | 12/1997 | Chen et al. | 438/396 |
| 5,846,860 | 12/1998 | Shih et al. | 438/253 |

*Primary Examiner*—Tuan H. Nguyen
*Attorney, Agent, or Firm*—Beyer & Weaver, LLP

[57] ABSTRACT

Disclosed are planar DRAM cells including a storage capacitor having a high dielectric constant capacitor dielectric. The DRAM cell also includes an access transistor having a gate dielectric which does not include the high dielectric constant material. A single polysilicon layer is employed to form the gate electrode of the access transistor and a reference plate of the storage capacitor. A disclosed fabrication process forms the high dielectric constant material that is limited to a capacitor region of the DRAM cell and then forms the gate dielectric over an entire active region including both the high dielectric constant material layer at the capacitor region and the semiconductor substrate at the access transistor region. In this manner, a high quality gate dielectric (e.g., silicon oxide) is formed at the access transistor region and a high dielectric constant dielectric layer (e.g., silicon nitride) is formed at the capacitor region. A capacitor plate and a gate electrode are formed by patterning the same conductive layer (e.g., doped polysilicon) formed over top of the gate dielectric.

14 Claims, 7 Drawing Sheets

METHOD OF FORMING DRAM CAPACITOR BY FORMING SEPARATE DIELECTRIC LAYERS IN A CMOS PROCESS

This is a Divisional application of co-pending prior application Ser. No. 09/057,156 filed on Apr. 7, 1998, the disclosure of which is incorporated herein by reference.

BACKGROUND OF THE INVENTION

The present invention relates to dynamic random access memory (DRAM) cells and methods of fabricating them. More particularly, the invention relates to single polysilicon layer planar DRAM cells having high capacitance.

Many processes exist for forming DRAM cells, either in dedicated DRAM memory chips or as embedded DRAM regions in logic chips. Similarly, DRAM cells take many shapes and forms. The simplest employ a single access transistor, but other designs employ additional transistors as well. The storage capacitors in DRAM cells have taken many forms. For example, some are formed coplanar with the substrate surface, others as a trench extending into the substrate, still others as a fin protruding above the substrate surface, etc. The exotic trench and fin structures provide high surface area capacitor plates and therefore high capacitance cells. This allows a high density of DRAM cells to be provided on a single chip or chip region. Unfortunately, the processes for making such exotic structures are highly complex and can be quite difficult and expensive to implement.

DRAMs having planar capacitor plates are inherently easier to fabricate. However, because their planar capacitor plates have a relatively large storage surface for charge storage area per unit of chip surface area (in comparison to trench or fin designs, for example), competitive high density DRAM arrays may press the lower limits of cell capacitance. Unfortunately, it is not possible to reduce cell capacitance to very low levels. In current DRAM technology, the lower limit of cell capacitance is about 25 femtofarads. The capacitance of a cell is directly proportional to the dielectric layer's charge storage area and its dielectric constant. The cell capacitance is inversely proportional to the dielectric layer's thickness. Thus, because a planar-type DRAM capacitor has a relatively low charge storage surface area, it must have a dielectric layer that is relatively thin and/or has a relatively high dielectric constant (in comparison to fin and trench type capacitors) in order to be competitive.

Most conventional processes of forming planar DRAM cells involve using two dielectrics: one as the capacitor dielectric (typically an oxynitride) and one as the access transistor dielectric (typically oxide). A few simpler processes employ a single dielectric layer as both the gate dielectric and the capacitor dielectric. Typically, the material used in single dielectric processes is silicon oxide which has a dielectric constant of about 3.9. In current sub-micron processes, the gate oxide is typically grown to a thickness of less than about 50–100 angstroms. Under these constraints, planar DRAM cells must occupy more surface area than is suitable for many applications. Further, most all processes of forming DRAMs employ two polysilicon layers, adding significant complexity to the process.

What is needed therefore is an improved process in which a planar DRAM cell design can be implemented with reduced substrate surface area being occupied.

SUMMARY OF THE INVENTION

The present invention provides memory cells including a storage capacitor having a capacitor dielectric including a high dielectric constant material. The memory cells also include an access transistor having a gate dielectric which does not include the high dielectric constant material. Preferably, a fabrication process forms the high dielectric constant material that is limited to a capacitor region of the memory cell and then forms the gate dielectric over an entire active region including both the high dielectric constant material layer at the capacitor region and the semiconductor substrate at the access transistor region. In this manner, a high quality gate dielectric (e.g., silicon oxide) is formed at the access transistor region and a high dielectric constant dielectric layer (e.g., silicon nitride) is formed at the capacitor region. A capacitor plate and a gate electrode may be formed by patterning the same conductive layer (e.g., doped polysilicon) formed over top of the gate dielectric.

One aspect of the present invention provides a DRAM cell that may be characterized as including the following features: (a) a semiconductor substrate; (b) a storage capacitor having a storage plate, a reference plate, and a capacitor dielectric formed on the semiconductor substrate and including a layer of a high dielectric constant material; and (c) an MOS access transistor electrically coupled to said storage plate and having a gate electrode and a gate dielectric layer which does not include the layer of the high dielectric constant material. In a preferred embodiment, the capacitor dielectric includes the gate dielectric layer as well as the layer of high dielectric constant material. In one embodiment, the gate electrode of the access transistor and the reference capacitor plate for the capacitor are formed of the same layer (e.g., a doped polysilicon layer with a silicide layer). In this embodiment, the storage plate is formed in the substrate where it contacts the capacitor dielectric.

In a preferred embodiment, the gate dielectric layer is a silicon oxide layer and the high dielectric constant layer is a layer of material having a dielectric constant of at least about 7 (e.g., a silicon nitride layer or a tantalum oxide layer). In an especially preferred embodiment, the capacitor dielectric includes (i) a thin oxide layer contacting the surface of the substrate, (ii) a silicon nitride layer formed on the thin oxide, and (iii) a silicon oxide gate dielectric formed on the silicon nitride layer.

Preferably, the DRAM cells of this invention form part of a larger DRAM array. In such case, the gate electrode of the above-described DRAM cell is connected to a word line which connects together a number of gate electrodes in adjacent DRAM cells. Similarly, a row of reference capacitor plates in adjacent DRAM cells may be connected to one another by a reference voltage line which holds the reference capacitor plates at a reference voltage (e.g., Vcc/2).

Another aspect of the present invention provides a DRAM array in which two DRAM cells are provided on active regions. This aspect of the invention may be characterized by the following features: (a) a semiconductor substrate having a surface in which the array is formed; (b) an isolation region electrically isolating a plurality of active regions from one another; and (c) an active region including: (i) first and second access transistors sharing a common source, each having a gate electrode, and each having a gate dielectric formed on said substrate from a common gate dielectric layer; (ii) first and second planar storage capacitors electrically coupled to the first and second access transistors, respectively, and each including a storage plate, a reference plate, and a capacitor dielectric including a high dielectric constant layer. Typically, the array will also include a word line and a bit line. The word line connects the gate electrode of the first access transistor to a plurality of other gate electrodes of access transistors on other active regions. The bit line electrically connects to the common source.

Another aspect of the invention provides a method of forming a DRAM cell. The method may be characterized as including the following sequence: (a) on a semiconductor substrate, forming an electrical isolation region about an active region on which the DRAM cell is formed; (b) forming a layer of high dielectric constant material on the active region of the semiconductor substrate; (c) removing the high dielectric constant material from an access transistor region of the active region while leaving the high dielectric constant material on a capacitor region of the active region; (d) forming a gate dielectric layer over the access transistor region and over the high dielectric constant material layer on the capacitor region; and (e) forming a gate electrode on the gate dielectric at the access transistor region and forming a capacitor plate on the gate dielectric at the capacitor region. Preferably, the method also includes performing an implant in the semiconductor substrate at the capacitor region in order to form a storage capacitor plate. The overall method usually also includes forming source and drain regions in the semi-conductor substrate at the access transistor region.

In order to provide high capacitance storage capacitors, the layer of high dielectric constant material is preferably a layer of silicon nitride formed to a thickness of not more than about 70 angstroms. Preferably, the gate dielectric is a silicon oxide layer grown to a thickness of between about 25 and 70 angstroms. Both the high dielectric constant material layer and the gate dielectric layer should be substantially planar.

The process for forming the gate electrode and the capacitor plate preferably includes (i) depositing a conductive layer (e.g., a doped polysilicon layer) over the dielectric layers on the semiconductor substrate; and (ii) patterning the conductive layer to form the gate electrode at the access transistor region and the capacitor plate at the capacitor region. The process may, in addition, involve forming a silicide layer on the conductive layer. The patterning may define a word line connecting the gate electrode to other gate electrodes of other access transistors. It may also define a reference voltage line connecting the reference capacitor plate to other reference capacitor plates of other capacitor regions.

Further details and advantage of the present invention will be described below with reference to the appended drawings.

DETAILED DESCRIPTION OF THE PREFERRED EMBODIMENTS

Figure 1:
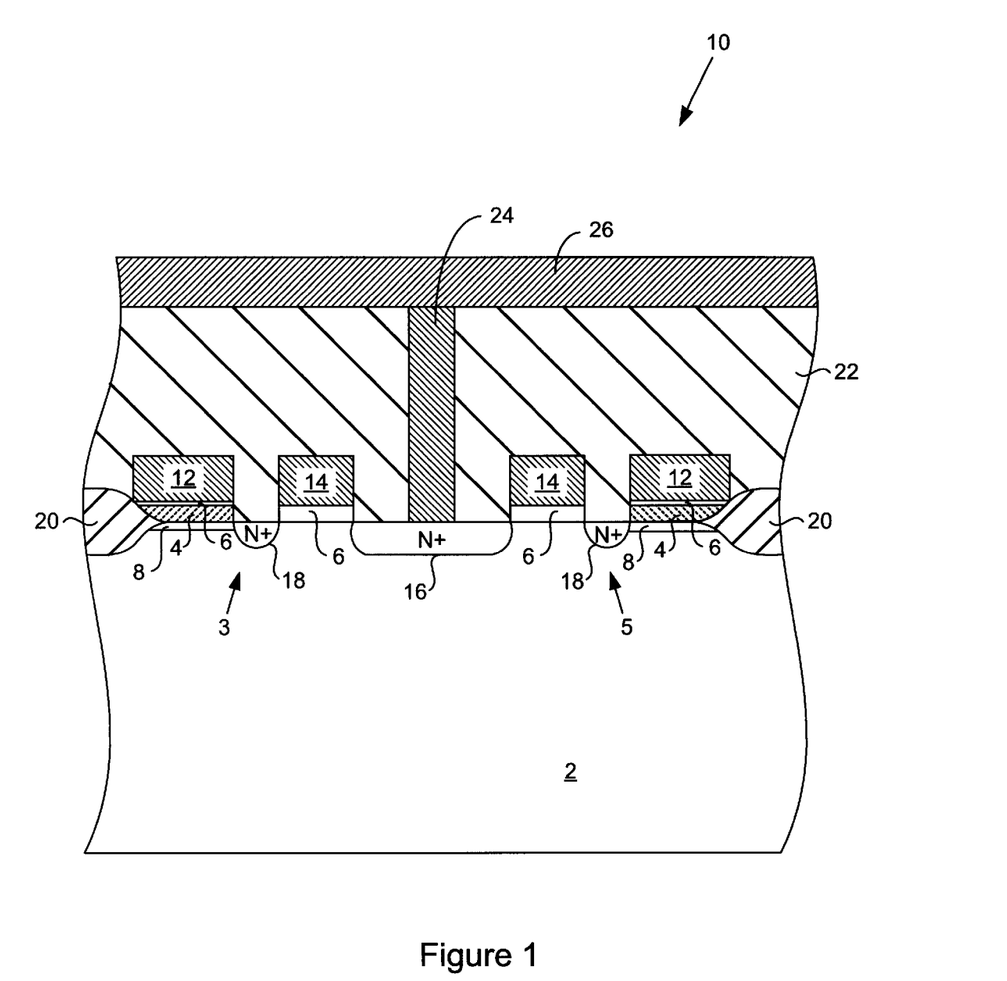
FIG. 1 is a cross-sectional view of a two DRAM cell structure having a high dielectric constant material in the capacitor dielectric in accordance with one embodiment of this invention.

The present invention allows different dielectric layers to be deposited at the gate electrode and capacitor regions. Thus, the present invention gives the DRAM designer additional ability to reduce the capacitance of access transistors and increase the capacitance of storage capacitors. A preferred embodiment of the present invention is now described with reference to the associated figures where like reference numbers indicate identical or functionally similar elements. FIG. 1 illustrates a cross section of a two-cell layout in the DRAM structure of the instant invention. The remaining figures illustrate formation of the two-cell DRAM structure shown in FIG. 1. While the invention will be described in conjunction with this preferred embodiment, it will be understood that it is not intended to limit the invention to one preferred embodiment. To the contrary, it is intended to cover alternatives, modifications, and equivalents as may be included within the spirit and scope of the invention as defined by the appended claims.

Turning now to FIG. 1, a cross-sectional view of a section of a DRAM array constructed in accordance with an embodiment of this invention is shown. In this figure, a DRAM array 10 is formed on a semiconductor substrate 2. Preferably, though not necessarily, substrate 2 is made from a monocrystalline silicon wafer. It may include a region of epitaxially grown silicon as well.

In section 10, two DRAM cells (a first cell 3 and a second cell 5) are formed on a common active area and share a common source region 16 which is a highly doped N+ diffusion region extending downward into substrate 2 from its surface. Each of DRAM cells 3 and 5 include an access transistor and a storage capacitor. The access transistors include a thin layer of gate dielectric 6 on which is formed a gate electrode 14. The access transistors each have their own drain region 18 but share a common source region 16 as mentioned. Drain regions 18 are highly doped N+ diffusion regions as shown. In alternative embodiments, not shown, the source and drain regions may include lightly doped drain tips to protect against the hot electron effect.

The storage capacitors in DRAM cells 3 and 5 include a storage plate 8, a reference plate 12, and a capacitor dielectric including a lower layer 4 of high dielectric constant material and an upper layer 6 of gate dielectric material. The high dielectric constant material layer 4 preferably has a dielectric constant of at least about 7. Examples of suitable materials include tantalum penatoxide, silicon nitride and other high dielectric constant materials that are compatible with the process employed to form the DRAM cells. Gate dielectric layer 6 is preferable a silicon oxide. In a preferred fabrication process of this invention, the gate dielectric component of the access transistors and the storage capacitors is formed at the same time via a thermal oxidation process. Storage plate 8 is preferably an N doped diffusion region provided at the surface of substrate 2 and underlying high dielectric constant capacitor dielectric layer 4.

In the embodiment shown, semiconductor substrate 2 is preferably a lightly doped P-type silicon crystal. Preferably, it has a P-type dopant concentration of between $1 \times 10^{14}$ and $5 \times 10^{18}$ atoms/cm$^3$. The P-type dopant may be boron, for example. In an alternative embodiment, the plurality of the device is reversed, that is source region 16, drain regions 18, and storage plate 8 are all P-type doped regions. In this alternative embodiment, substrate 2 will then be lightly doped N-type material.

Storage plate 8 is electronically coupled to access transistor drain region 18. Preferably, the dopant concentration in plate region 8 (e.g., between about $1 \times 10^{18}$ and $5 \times 10^{21}$ atoms/cm$^3$) is lower than or equal to the dopant concentration in drain region 18 (e.g., between about $5 \times 10^{20}$ and $5 \times 10^{21}$ atoms/cm$^3$). The quantity of charge accumulated in storage plate 8 determines whether the DRAM is storing a 0 or a 1 at any instant. Reference plate 12 is held at a constant potential and is preferably connected to other reference plates of other capacitors via a conductive line running in the direction normal to the plane of the page. Preferably, gate electrode 14 and reference plate 12 are formed of the same conductive layer which may be polysilicon, silicided polysilicon, etc. Gate electrodes 14 are preferably coupled to other gate electrodes on other DRAM cells (not shown) via word lines which proceed in a direction normal to the plane of the page.

The active region of substrate 2 including DRAM cells 3 and 5 is bounded by a field oxide 20 which electrically isolates groups of two DRAM cells from one another. In an alternative embodiment, the active regions are bounded by a trench isolation or other suitable isolation structure. Overlying the DRAM cells 3 and 5 is a passivation layer 22 (sometimes referred to as an inter-layer dielectric or ILD) made from a dielectric material such as a glass (e.g. borophosphosilicate glass).

DRAM cells 3 and 5 are written to and read from via a bit line 26 which is a conductive metal line such as an aluminum or copper line formed by patterning a metallization layer. Bit line 26 is electrically connected to the access capacitors of DRAM cells 3 and 5 via a conductive contact 24 to source region 16. Contact 24 may be a tungsten filled contact hole vertically etched through ILD 22, for example.

One suitable fabrication process for producing memory cells in accordance with this invention will now be described. This process may be employed to form structures like that shown in FIG. 1 or slightly different structures with minor modification to the process steps.

Figure 2A:
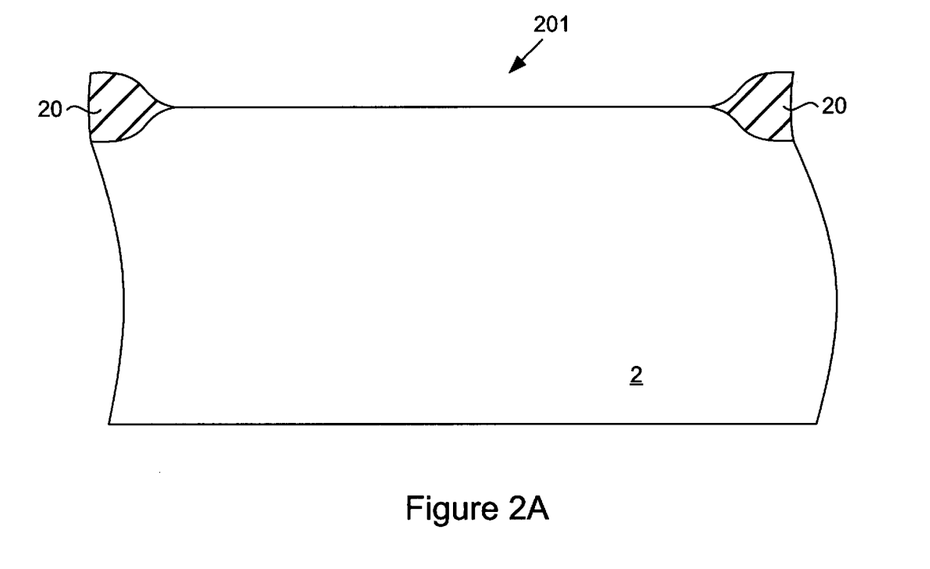
FIG. 2A is a cross-sectional view of a semiconductor substrate in which an active region has been defined by a field oxide.
Figure 2B:
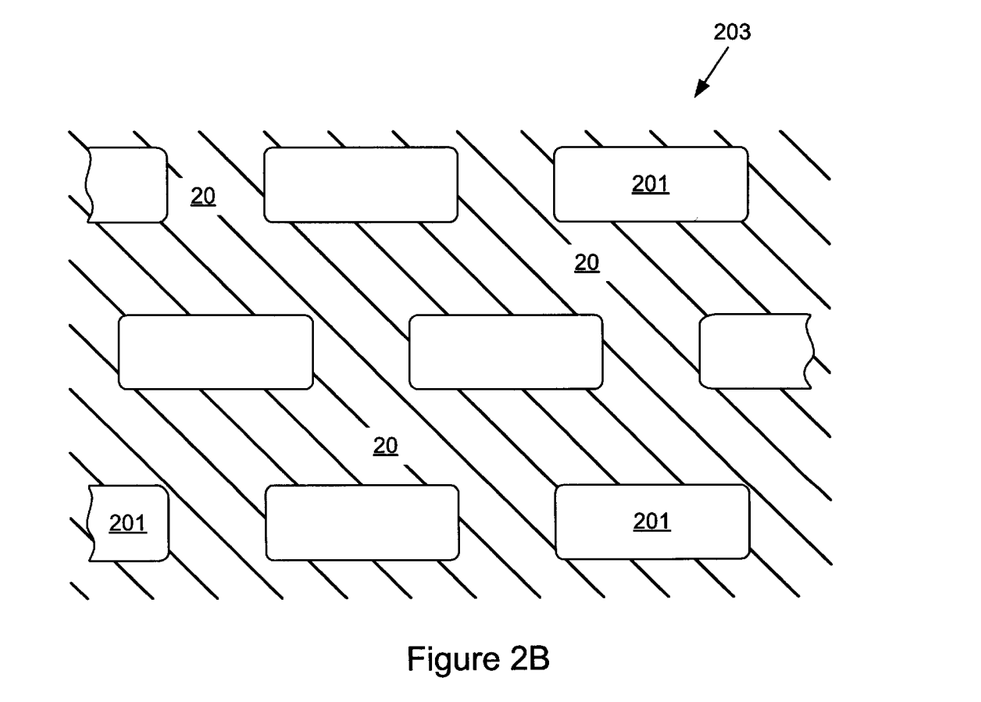
FIG. 2B is a top view of a DRAM array illustrating active regions represented in cross section by FIG. 2A.

Turning now to FIGS. 2A and 2B, some early steps of the process are depicted. Initially, semiconductor substrate 2 has its surface masked in a pattern defining a plurality of active regions 201 surrounded by field oxide isolation region 20. The mask protects active regions 201. Then, field oxide 20 is grown in the isolation region. Field oxide 20 may be grown by a conventional process such as the local oxidation of silicon (LOCOS). Alternately, isolation region 20 may be a trench isolation region formed by etching a trench into substrate 2 in the region surrounding active regions 201 and then filling such trench and insulating material such as silicon oxide. Trench isolation usually has well defined boundaries and edges, and will not generally produce the rounded edges associated with field oxide as illustrated in FIG. 2B.

Regardless of how isolation region 20 is formed (it will be assumed to be a field oxide for the remainder of this discussion), the mask protecting active regions 201 is removed from the structure shown in FIGS. 2A and 2B. FIG. 2A is a cross-sectional view through substrate 2 taken in the same section as that of DRAM structure 10 as shown in FIG. 1. FIG. 2B is a top view of a DRAM array 203 including many active regions 201. In the embodiment depicted herein, the rows of active regions 201 alternate in their offset in order to improve cell density and facilitate line routing. Each of active regions 201 ultimately supports two DRAM cells such as DRAM cells 3 and 5 shown in FIG. 1.

Figure 3A:
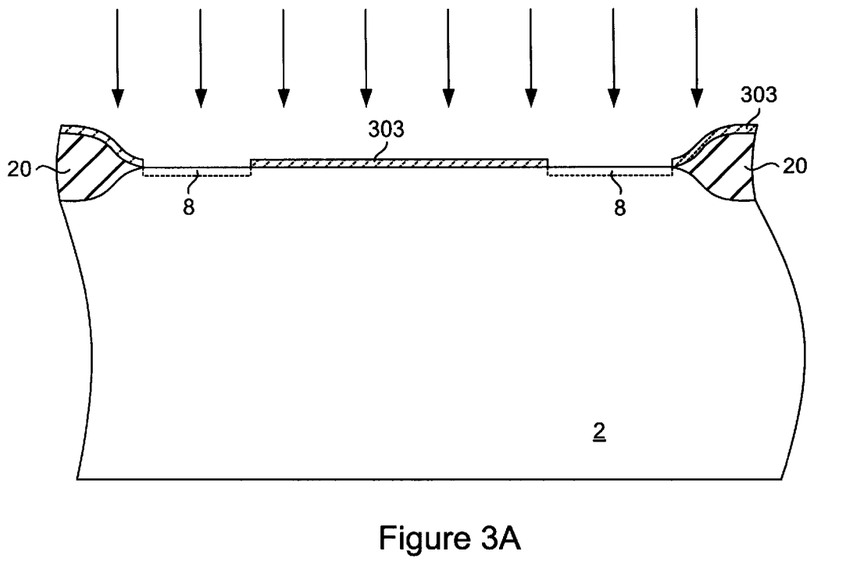
FIG. 3A is a cross section of an active region during the process of forming capacitor storage plates in accordance with an embodiment of this invention.
Figure 3B:
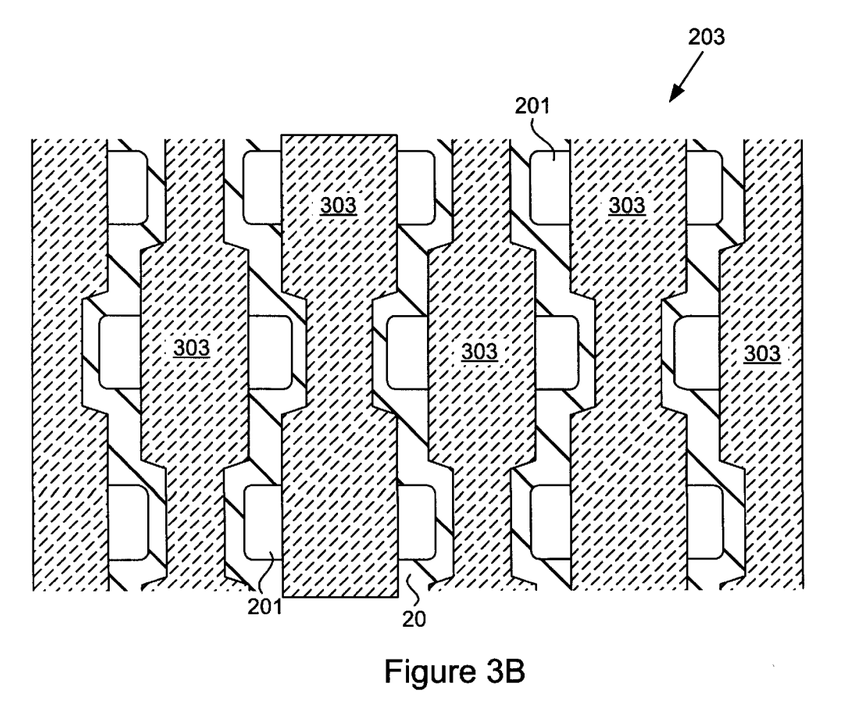
FIG. 3B is a top view of a partially fabricated DRAM array showing the locations of a photomask used during an ion implantation step to form the capacitor storage nodes illustrated in FIG. 3A.

After active regions 201 are electrically isolated as described, threshold voltage implants for the access transistors may optionally be formed in the channel regions of those access transistors (e.g. in substrate 2 at the regions underwhich gate electrodes 14 will ultimately be formed). Such implants are formed in the channel regions of the access transistors and are intended to increase the threshold voltage of the transistors as is known in the art. After any such threshold voltage adjustment implants are performed, a storage plate mask 303 is formed as shown in FIGS. 3A and 3B. Photoresist mask 303 may be a layer of silicon nitride which has been patterned to define openings to the substrate at regions where storage plates 8 are to be formed. Note that FIG. 3B illustrates in a top view how the mask may be laid out in two-dimensional DRAM array 203. In this embodiment, an N-type ion implant is then performed to deposit N-type dopant in regions 8. Examples of suitable N-type dopants are arsenic and phosphorus. After implantation, the partially fabricated device is annealed to define storage plates 8 under annealing conditions well known in the art. In a preferred embodiment, the ion implantation and anneal conditions are performed such that storage plates 8 have a diffusion depth of between about 0.1 and 0.25 micrometers and an average concentration in that area of between about $1 \times 10^{18}$ and $5 \times 10^{21}$ atoms/cm$^3$. In the reverse polarity embodiment, regions 8 will be doped with a P-type dopant such as boron. After storage capacitor plates 8 have been formed in substrate 2, mask 303 is stripped away and the entire wafer is cleaned to provide a clean silicon surface in active regions 201.

Figure 4:
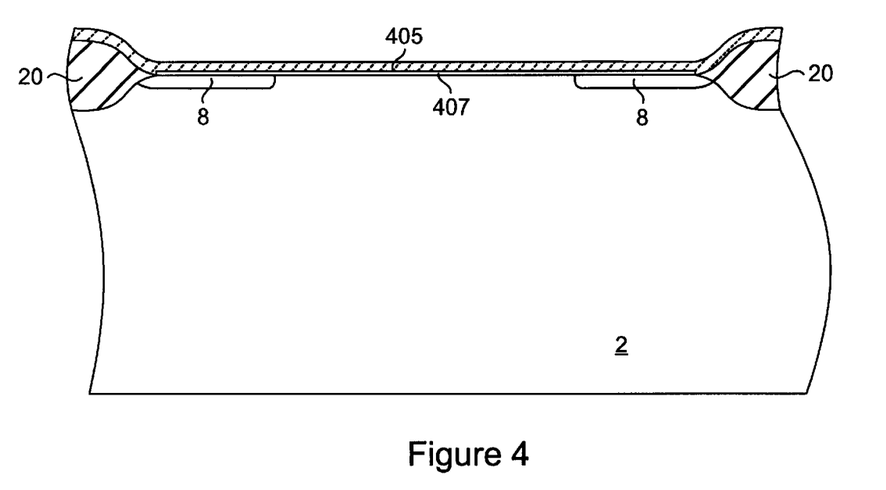
FIG. 4 is a cross-sectional view of the active region of a partially fabricated DRAM array after a high dielectric constant material has been deposited in accordance with an embodiment of this invention.

At this point, at least a portion of the capacitor dielectric is formed as illustrated in FIG. 4. Optionally, a thin oxide layer 407 is formed by thermal oxidation of the surface of substrate 2, for example. If oxide layer 407 is formed, it is kept relatively thin—on the order of between about 10 and 50 angstroms in one embodiment. Regardless of whether or not oxide layer 407 is formed, a layer of high dielectric constant material 405 is deposited over the entire surface of the partially fabricated DRAM array.

High dielectric constant layer 405 maybe made from any compatible material having a high dielectric constant. Generally, the dielectric constant of the material comprising layer 405 should be greater than that of silicon oxide; silicon oxide has a dielectric constant of about 3.9. Preferably, the dielectric constant of the material in layer 405 is greater than about 7. Examples of suitable materials meeting this criteria include silicon nitride ($Si_3N_x$ which has a dielectric constant of about 7.6) and tantalum pentaoxide ($Ta_2O_5$). The thickness of layer 405 will depend upon which material is used to form the layer. Generally, materials with higher dielectric constants can be deposited more thickly while maintaining the same capacitance than materials having lower dielectric constants, which must be deposited more thinly. Preferably, high dielectric constant material 405 is grown as thin as practicable in order to provide the highest capacitance. However, it should not be made so thin that it contains pin holes or other defects which allow charge to leak through it during normal operation of a capacitor. In the case of silicon nitride, for example, layer 405 is preferably not greater than about 70 angstroms thick, more preferably between about 20 and 60 angstroms thick. A silicon nitride layer may be deposited by chemical vapor deposition under conditions conventionally employed in the art.

Figure 5A:
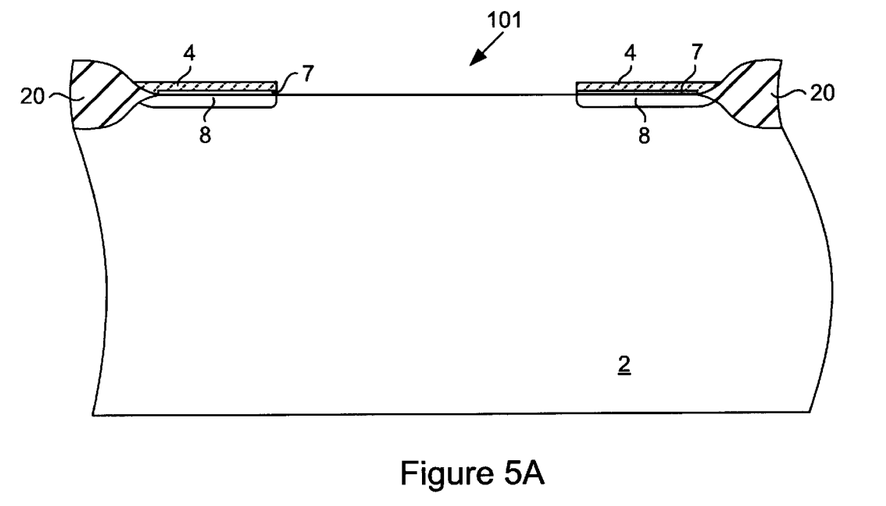
FIG. 5A is a cross-sectional view of the structure shown in FIG. 4 after the high dielectric constant material layer has been patterned to define all or a portion of the capacitor dielectric.
Figure 5B:
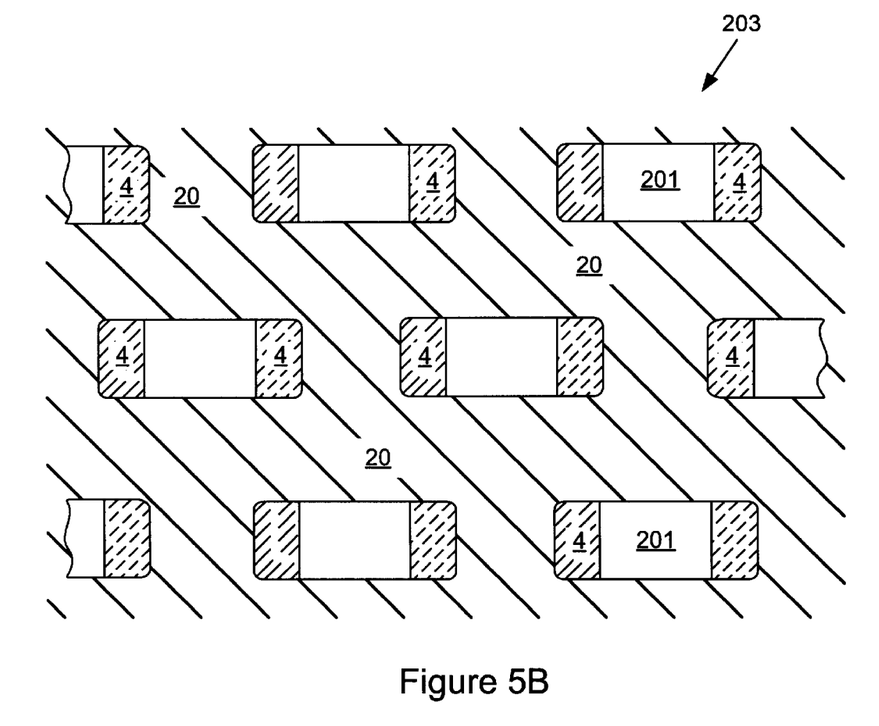
FIG. 5B is a top view of the partially fabricated DRAM array after the step of patterning the high dielectric constant material has been performed as illustrated in FIG. 5A.

Because the capacitor dielectric is needed only in the capacitor regions of the DRAM cells (and can be detrimental elsewhere), some of layer 405 must be removed. This is accomplished by masking the capacitor regions of the DRAM cells and then etching away the exposed dielectric layer. Layer 405 should be etched by whatever techniques and conditions produce the least defective substrate surface. Layer 407 may also provide some protection for the surface of substrate 2 during the etching step. A wet or dry etch may be employed to remove silicon nitride. In one improved embodiment, the exposed nitride is contacted with hot phosphoric acid for less than about twenty minutes. After the photoresist masks are removed, the structure that remains appears as shown in FIGS. 5A and 5B. As shown in FIG. 5B in top view, active regions 201 of DRAM array 203 include peripheral regions of high dielectric constant gate dielectric 4.

Figure 6:
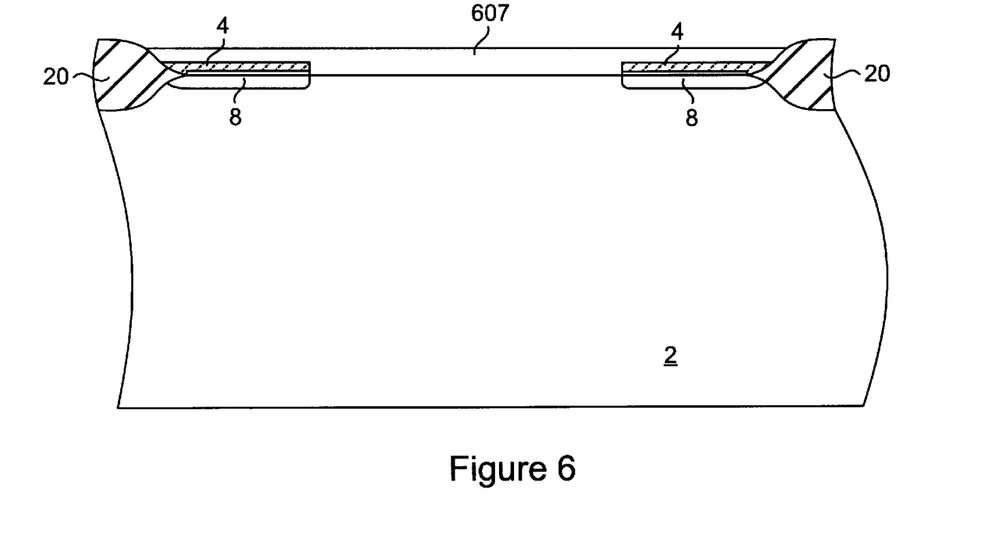
FIG. 6 is a cross-sectional view of a partially fabricated DRAM array after a gate dielectric layer has been formed on an entire active region including the high dielectric layer components of the capacitor dielectrics.

After the high dielectric constant layer has been patterned for the capacitors, a gate dielectric must be formed. As shown in FIG. 6, a layer of gate dielectric 607 is formed on the active regions of DRAM array 203. In one preferred embodiment, gate dielectric layer 607 is a thermally grown silicon oxide. In this case, gate dielectric 607 will grow thicker over the exposed regions of semiconductor substrate 2 than in the regions over high dielectric constant material layer 4. This is because silicon substrate 2 provides a more easily accessible source of silicon atoms than silicon nitride layers 4. While gate dielectric layer 607 is shown having a relatively planar top surface, this need not be the case. It simply depends on how long layer 607 is grown. If it has grown for relatively long periods of time, its top surface will be higher in the region between layers 4. Alternatively, if it has grown for relatively short periods of time, its top surface will be lower in the regions between dielectric layers 4. If gate dielectric 607 is silicon oxide, it is grown to a thickness of preferably no more than about 100 angstroms. More preferably, it is between about 25 an 70 angstroms thick. Of course, the actual thickness depends upon the particular fabrication technology being employed. For 0.18 micrometer technology, a gate dielectric is typically grown to about 35 angstroms thick.

Figure 7:
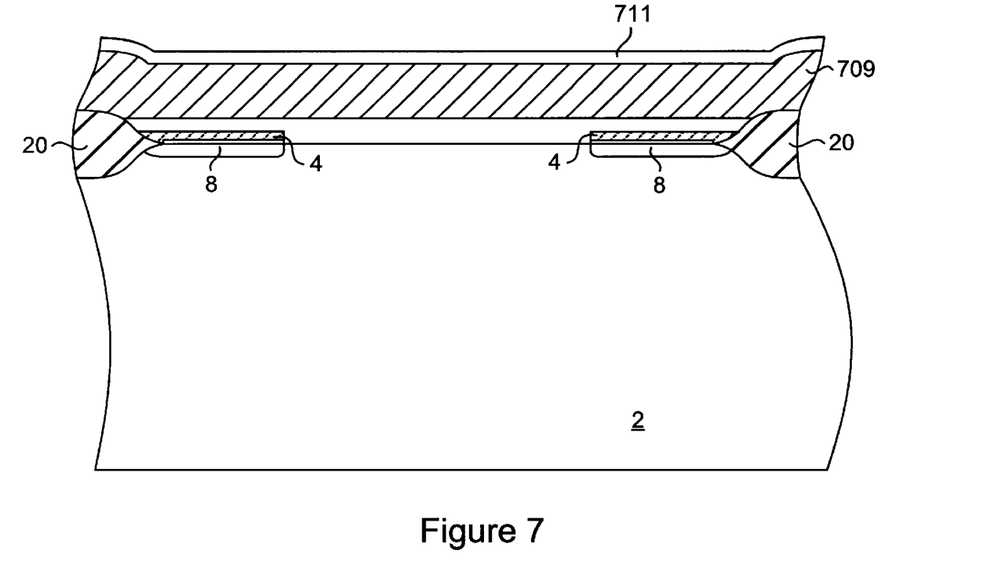
FIG. 7 is a cross-sectional view of a partially fabricated DRAM array in which a conductive layer (which will ultimately form the gate electrodes and reference capacitor plates) is formed over the gate dielectric in accordance with an embodiment of this invention.

At this point, the storage plates and capacitor dielectrics have been formed for the DRAM capacitors, however, the reference plates remain to be formed. The process of forming these plates begins by forming a conductive layer 709 over the surface of the partially fabricated array, as shown in FIG. 7. In one preferred embodiment, conductive layer 709 is a polysilicon layer conformably deposited to a thickness of between about 1000 and 3000 angstroms. A conventional chemical vapor deposition process may be employed for this purpose. Layer 709 may provide the material for both the gate electrodes for the access transistors and the reference plates of the capacitors. In a preferred embodiment, conductive layer 709 is covered by a silicide layer 711 in order to enhance the conductivity of the subsequently formed gate electrodes and capacitor plates. The resulting structures is shown in FIG. 7. Silicide layer 711 may be formed by any conventional process. In the case to titanium and cobalt silicides, a metal layer of titanium or cobalt is first deposited and then the resulting structure is annealed to form the silicide. In the case of tungsten silicide, the silicide itself may be formed via a chemical vapor deposition process, without the need for a subsequent anneal step.

Figure 8A:
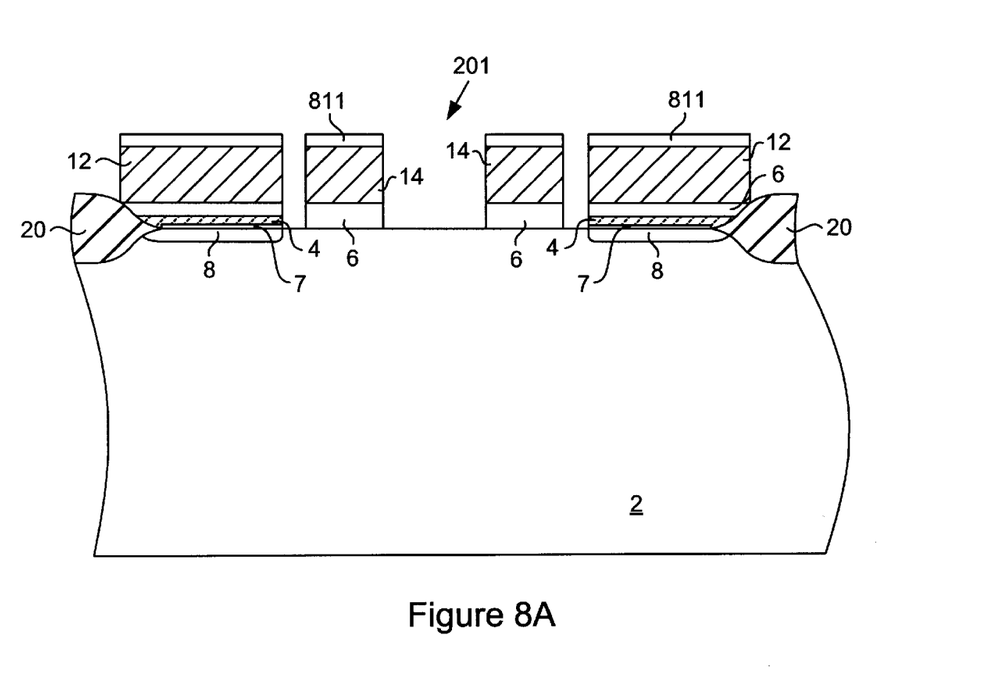
FIG. 8A is a cross-sectional view of a partially fabricated DRAM array after the conductive layer shown in FIG. 7 has been patterned to define gate electrodes and capacitor reference plates.
Figure 8B:
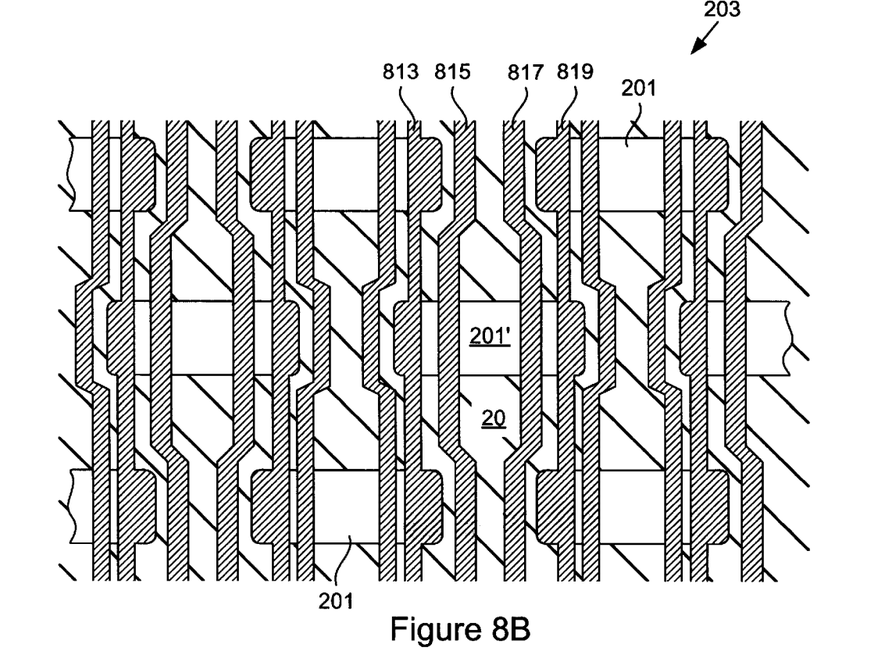
FIG. 8B is a top view of the DRAM array shown in cross section of FIG. 8A and illustrating word lines and reference lines.

After conductive layer 709 (and optional layer 711 if present) are patterned, the resulting structure appears as shown in FIGS. 8A and 8B. Referring first to FIG. 8A, a cross-section of the partially fabricated DRAM cells includes two gates in the inner portion of active region 201. These gates include a gate dielectric 6 directly contacting the top surface of semiconductor substrate 2. They also include a gate electrode 14 (preferably polysilicon) which may be capped with a silicide layer 811. The capacitors of the two cells in active region 201 are now completely formed and reside at the edges of the active region. These capacitors include storage plates 8, reference plates 12 (preferably polysilicon), and multi-layer capacitor dielectrics. The capacitor dielectrics should include at least the layer of high dielectric constant material 4. They will also typically include a thin upper layer of gate dielectric 6. It may optionally include a thin bottom oxide layer 7. The reference plate 12 is optionally capped with silicide layer 811.

FIG. 8B shows a top view of DRAM array 203 after the conductive layer 709 has been patterned. Gate electrodes 14 form parts of word lines which extend vertically (FIG. 8B) and in a direction normal to the plane of the page when viewing a cross section of the array (FIG. 8A). In FIG. 8B, multiple word lines are shown. Two of them associated with an active region 201' are a word line 815 and a word line 817.

The reference plates 12 of the DRAM cells are connected to other reference plates in other active regions. This connection preferably takes a form of patterned lines of layer 709. As shown in FIG. 8B, reference lines 813 and 819 connect the reference plates of active region 201' with the reference plates of DRAM cells and other active regions. In the resulting DRAM structure, the reference lines are held at a reference voltage chosen to work with the sense amplifier. In one preferred embodiment, the reference voltage is Vcc divided by 2.

Figure 9:
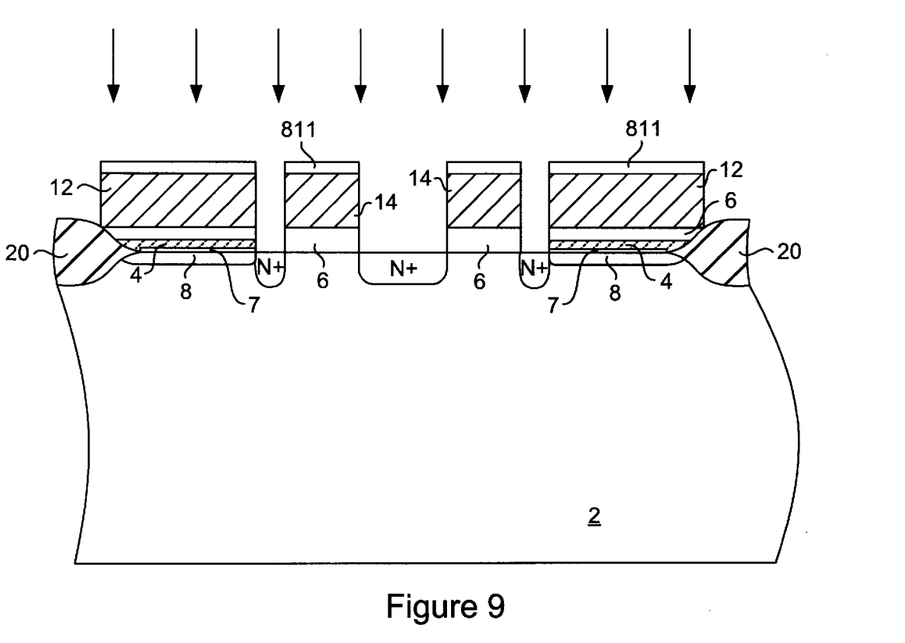
FIG. 9 is a cross-sectional view of a DRAM array illustrating the process of forming source and drain regions for access transistors in a two DRAM-cell active region of the DRAM array.

After the word lines and reference lines are formed by a patterning conductive layer 709, the access transistors are completed by performing a source/drain ion implant. In a device of the polarity described to this point, the ion implant with be an N-type ion implant. Thus, arsenic or phosphorus is preferably used as the implantation ion. The implant conditions should be chosen to provide shared N+ source region 16 and N+ drain regions 18 as shown in FIG. 9. In one preferred embodiment, source and drain regions 16 and 18 have a concentration of about $1\times10^{20}$ and $5\times10^{21}$ atoms/cm$^3$.

An optional step of forming spacer oxides at the gate electrodes may be employed as is well known in the art. Such spacers are conventionally used in processes in which the source and drain regions are formed in two steps: a first step to form lightly doped drain regions, and a second step to form the remainder of the source and drain regions.

At this point, the basic structure of the DRAM cell is complete. All that remains to be done is the electrical wiring of the source regions to the bit lines. The resulting structures shown in FIG. 1 which was described above.

Suitable back end process steps will now be described. Initially, a passivation layer (ILD) is deposited over the word lines and bit lines. It may be planarized if necessary. A contact mask is then formed on the passivation layer to define contact regions to common source regions and any other appropriate device elements on the substrate or polysilicon. Thereafter, the passivation region is etched (typically by a plasma etch) to form vertical contact holes through the passivation layer to the underlying substrate and polysilicon. At this point, a diffusion barrier layer (sometimes referred to as a "glue" layer) made of a material such as a titanium nitride layer is formed to protect the device elements adjacent the contact holes from ingress of metal atoms from a subsequently deposited metallization layer. In some processes, the contact holes are filled with tungsten plugs according to procedures known in the art. A planarization step may be needed after the via holes are filled. Regardless of whether tungsten plugs are formed, a blanket deposition of a first metallization layer is performed. The first (and all subsequent) metallization layers may be made from various metals used in the industry such as aluminum (Al), aluminum copper (AlCu), or aluminum silicon copper (AlSiCu). These layers are conventionally deposited by sputtering, as is well known in the industry.

After the first metallization layer has been deposited, it is patterned to form lines connecting various DRAM cells. The exact layout of the lines will be determined by the particular DRAM design. The patterning is done by first depositing a mask such as a photoresist and then exposing it to light to define the pattern of metal lines to be created in a subsequent etch step. Thereafter, the underlying first metallization layer is etched by a plasma process such as reactive ion etching (RIE).

After the first metallization layer has been etched, the photoresist is removed and a dielectric layer is deposited over the first metallization layer in order to insulate this metallization layer from the next successive metallization layer (i.e., the second metallization layer). Typically, oxide or borophosphosilicate glass is used as the dielectric layer, but other dielectrics such as a nitride, spin on glass (SOG), or polyimide films (which can also be laid on by spinning) may also be used. The dielectric layer is then planarized by any appropriate technique. After a dielectric layer has been formed and planarized as described, a via mask is formed on the dielectric layer's upper surface. The via mask will define vias or regions where interconnects between the first and second metallization layers are to be formed. Thereafter, another plasma assisted etch is performed to create the actual vias in the dielectric layer. These are then filled with tungsten (which is planarized), before the next metallization layer (metal-2) is deposited and patterned as described above. In some cases, it may be necessary to form and pattern one or more additional metallization layers to complete the wiring of the DRAM.

Generally, the DRAMs of this invention can be used in any application where conventional DRAMs find use, They may be used in DRAM chips or as embedded memory in logic chips. Specific examples of embedded memory chips which can make use of the DRAM designs of this invention include printer and graphics integrated circuits.

While this invention has been described in terms of several preferred embodiments, it is contemplated that alternatives, modifications, permutations and equivalents thereof will become apparent to those skilled in the art upon a reading of the specification and study of the drawings. It is therefore intended that the following appended claims include all such alternatives, modifications, permutations and equivalents as fall within the true spirit and scope of the present invention.

What is claimed is:

1. A method of forming a DRAM cell, the method comprising:

(a) on a semiconductor substrate, forming an electrical isolation region about an active region on which the DRAM cell is formed;

(b) forming a layer of high dielectric constant material on the active region of the semiconductor substrate;

(c) removing the high dielectric constant material from an access transistor region of the active region while leaving the high dielectric constant material at a capacitor region of the active region;

(d) forming a gate dielectric layer over the access transistor region and over the high dielectric constant material layer on the capacitor region; and (e) from a single layer of conductive material, forming a gate electrode on the gate dielectric at the access transistor region and forming a capacitor plate on the gate dielectric at the capacitor region.

2. The method of claim 1, further comprising performing a capacitor plate implant in the semiconductor substrate at the capacitor region.

3. The method of claim 1, wherein the high dielectric constant material has a dielectric constant of at least about 7.

4. The method of claim 1, wherein the high dielectric constant material is silicon nitride or tantalum pentaoxide.

5. The method of claim 1, wherein forming a layer of high dielectric constant material comprises forming a layer of silicon nitride to a thickness of not more than about 70 angstroms.

6. The method of claim 1, wherein forming the gate dielectric layer comprises thermally growing silicon oxide on the access transistor and capacitor regions such that the silicon oxide layer directly contacts the semiconductor substrate.

7. The method of claim 6, wherein the silicon oxide layer has grown to a thickness of between about 25 and 70 angstroms.

8. The method of claim 1, wherein the high dielectric constant material layer and the gate dielectric layer are substantially planar.

9. The method of claim 1, wherein forming the gate electrode and the capacitor plate comprises:

depositing a conductive layer over the semiconductor substrate; and patterning the conductive layer to form the gate electrode at the access transistor region and the capacitor plate at the capacitor region.

10. The method of claim 9, wherein the conductive layer is a doped polysilicon layer.

11. The method of claim 9, further comprising forming a silicide layer on the conductive layer.

12. The method of claim 9, wherein patterning defines a word line connecting the gate electrode to other gate electrodes of other access transistors.

13. The method of claim 9, wherein the capacitor plate is a reference capacitor plate and wherein the patterning defines a reference voltage line connecting the reference capacitor plate to other reference capacitor plates of other capacitor regions.

14. The method of claim 1, further comprising forming source and drain regions in the semi-conductor substrate at the access transistor region.

* * * * *